United States Patent [19]

Lo

[11] Patent Number: 4,660,275

[45] Date of Patent: Apr. 28, 1987

[54] METHOD OF MAKING CLEAVED-COUPLED-CAVITY (C³) DIODE LASERS

[75] Inventor: Wayne Lo, Troy, Mich.

[73] Assignee: General Motors Corporation, Detroit, Mich.

[21] Appl. No.: 824,459

[22] Filed: Jan. 31, 1986

Related U.S. Application Data

[62] Division of Ser. No. 645,249, Aug. 29, 1984, abandoned.

[51] Int. Cl.⁴ .................. H01L 21/304; H01L 23/34
[52] U.S. Cl. ................................ 29/569 L; 29/581; 29/583; 29/580; 148/DIG. 28; 148/DIG. 95; 372/36; 156/645; 156/629; 357/19; 357/17; 357/81
[58] Field of Search ............... 156/629, 645; 29/581, 29/583, 569 L; 148/DIG. 28, DIG. 95; 372/36; 357/19

[56] References Cited

U.S. PATENT DOCUMENTS 3,351,698 11/1967 Marinace .............................. 372/36
4,350,990 9/1982 Lo ....................................... 357/16

OTHER PUBLICATIONS

W. T. Tsang, N. A. Olsson, and R. A. Logan, "High-Speed Direct Single-Frequency Modulation with Large Tuning Rate and Frequency Excursion in Cleaved-Coupled-Cavity Semiconductor Lasers", *Applied Physics Letters*, v. 42, n. 8, pp. 650–652, (Apr. 15, 1983).

L. A. Coldren, B. I. Miller, K. Iga, and J. A. Rentschler, "Monolithic Two-Section GaInAsP/InP Active-Optical-Resonator Devices Formed by Reactive Ion Etching", *Applied Physics Letters*, v. 38, n. 5, pp. 315–317, (Mar. 1, 1981).

S. Kobayashi, Y. Yamamoto, M. Ito, and T. Kimura, "Direct Frequency Modulation in AlGaAs Semiconductor Lasers," *IEEE Journal of Quantum Electronics*, v QE-18, n. 4, pp. 582–595, (Apr. 1982).

W. Lo, "Cd-Diffused $Pb_{1-x}Sn_xTe$ Lasers with High Output Power," *Applied Physics Letters*, v. 28, n. 3, pp. 154–156, (Feb. 1, 1976).

W. Lo and D. E. Swets, "Diffused Homojunction Lead-Sulfide-Selenide Diodes with 140K Laser Operation," *Applied Physics Letters*, v. 33, n. 11, pp. 938–940 (Dec. 1, 1978).

C. Freed, J. W. Bielinski, and W. Lo. "Fundamental Linewidth in Solitary, Ultranarrow output $PbS_{1-x}Se_x$ Diode," *Applied Physics Letters*, v. 43, n. 7, pp. 629–631 (Oct. 1, 1983).

W. Lo, "Cleaved-Coupled-Cavity Lead-Salt Diode Lasers," *Applied Physics Letters*, v. 44, n. 12, pp. 1118–1119 (Jun. 15, 1984).

*Primary Examiner*—Brian E. Hearn
*Assistant Examiner*—Kevin McAndrews
*Attorney, Agent, or Firm*—Robert J. Wallace

[57] ABSTRACT

A method of making an optically coupled semiconductor laser having cleaved facing end walls and precise alignment and spacing. An indium coated face of a semiconductor laser diode bar is placed on an indium coated support. A knife edge cleaves the bar into two closely spaced and aligned semiconductor diode laser bodies and concurrently cold bonds them to the support. The knife edge is used without deleteriously affecting their bonding to the support.

4 Claims, 5 Drawing Figures

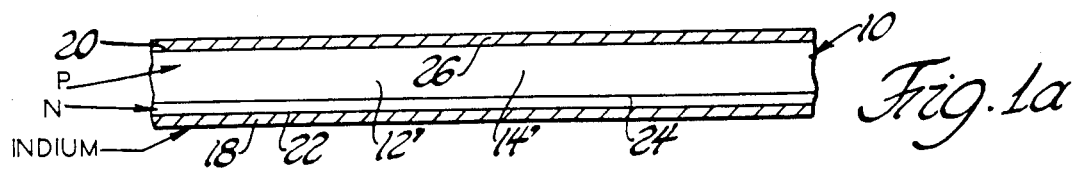
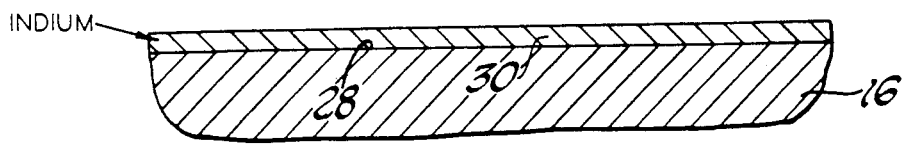
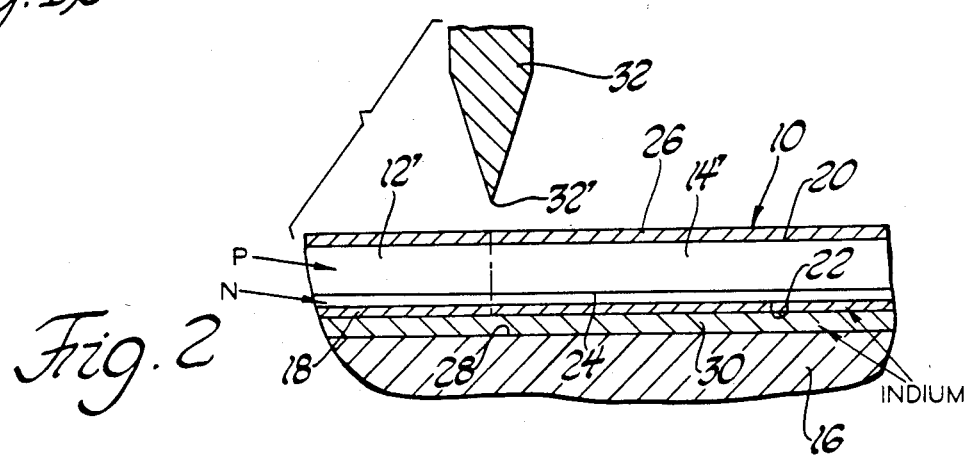
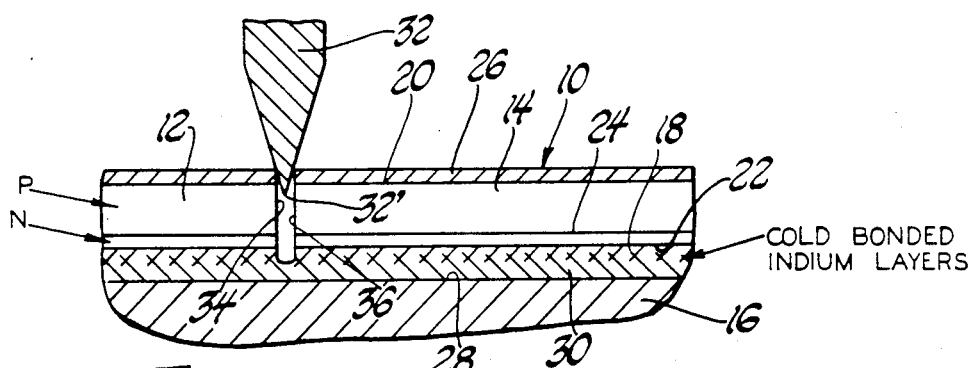
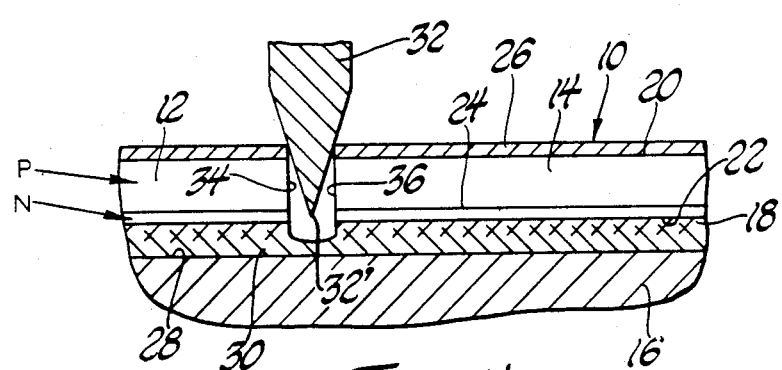

4,660,275

METHOD OF MAKING CLEAVED-COUPLED-CAVITY (C³) DIODE LASERS

This is a division of prior application Ser. No. 645,249 filed on Aug. 29, 1984, now abandoned.

This invention relates to cleaved-coupled-cavity semiconductor diode lasers. It especially involves an improved method of making such lasers.

BACKGROUND OF THE INVENTION

Optical fiber communication systems typically are based on amplitude modulation (AM) and direct detection of the optical energy. Optical fiber communication systems based on frequency modulation (FM) may offer performance benefits. However, satisfactory frequency tunable lasers, needed as transmitters in such systems, are not generally available. It has been found that two-cavity resonator laser structures provide optical amplification and direct frequency modulation. Such optically coupled semiconductor diode lasers are therefore of interest in optical fiber FM communication systems. The optical coupling is produced when two semiconductor diode laser cavities, i.e. Fabry-Perot cavities, are disposed end-to-end in a special way. The two semiconductor diode laser cavities must be very precisely longitudinally aligned and very precisely spaced apart only a very small distance, in order to produce a satisfactory optical coupling. In such instance, modulation of injection current for a smaller one of two semiconductor lasers produces a frequency shift in the output of the larger laser, which constitutes optical amplification.

Such structures appear to be quite useful in frequency modulated optical communication systems. However, an important factor limiting their use is the complexity involved in fabricating them. For example, it is well known that higher diode laser efficiency is obtained if the laser's Fabry-Perot cavity is more rectangular. By that I mean that the various faces of semiconductor bodies forming the laser cavities are more parallel or orthogonal to one another, as are produced by cleaving along crystal planes. On the other hand, obtaining precise alignment and precise close spacing of a pair of such cleaved bodies is difficult. If not precisely aligned and spaced, optimum optical coupling, that is frequency modulation efficiency, will not be obtained. Alignment, and to some extent spacing, problems can be avoided by making both laser cavities in a single body. This is achieved by etching a groove in one face of an elongated body, so as to divide the body into two integral Fabry-Perot cavities on that face. On the other hand, normal etching techniques do not produce the desired flat and parallel facing ends on the two resulting integral Fabry-Perot cavities. Thus, high efficiency laser cavities are not obtained, which in turn reduces frequency modulation efficiency.

I have found a simple method for producing both high efficiency laser cavities and high optical coupling. In a sense, the best of both the prior techniques is provided. In my method, I use well-established cleaving techniques to form high efficiency laser cavities. Cleaved semiconductor diode laser bodies are automatically highly longitudinally aligned and then precisely spaced, to form a very closely coupled two-cavity resonator. Concurrently, the laser bodies are bonded in place, so that their close optical coupling is preserved. In substance, I have therefore found an improved technique for producing cleaved-coupled-cavity (C³) semiconductor lasers.

OBJECTS AND SUMMARY OF THE INVENTION

It is therefore an object of this invention to provide an improved method of making cleaved-coupled-cavity semiconductor lasers.

A further object is to provide C³ diode lasers by my method.

The invention comprehends cleaving a monocrystalline semiconductor diode laser wafer to form a bar having a length equal to the two intended Fabry-Perot laser cavities of the resonator. The bar has electrodes on opposed major faces of the bar, with the outer surface of at least one electrode being of a cold bondable soft metal, such as indium. The soft metal surface of the bar is placed on a support coated with a metallurgically compatible soft metal. The bar is then given a final cleavage, that divides it into two precisely aligned laser bodies. They are precisely aligned because both parts are simultaneously cold bonded to the support while being cleaved. Only enough pressure is initially applied by the cleaving knife edge to produce the desired bar fracture and bonding. A further, and controlled, downward movement of the knife edge is then used to push the two parts further away from one another a precise distance needed to obtain a constructive optical interference between the laser bodies. The longitudinal movement of the laser bodies is easily accommodated by the soft metal bond. Thus, precise alignment is not significantly disturbed.

BRIEF DESCRIPTION OF THE DRAWING

Other objects, features and advantages will become more apparent from the following description of preferred examples thereof and from the drawing in which:

FIG. 1a shows a fragmentary cross-sectional view of a semiconductor diode laser bar containing two longitudinally aligned Fabry-Perot cavities;

FIG. 1b shows a fragmentary cross-sectional view of a supporting heat sink for the semiconductor laser body shown in FIG. 1a;

FIG. 2 shows a fragmentary cross-sectional view of the semiconductor diode laser bar of FIG. 1a assembled on the supporting heat sink of FIG. 1b under a cleaving knife edge;

FIG. 3 shows the FIG. 2 assembly as a composite body after bar cleavage; and

FIG. 4 shows the FIG. 3 assembly after a knife edge is used to push the two cleaved portions of the bar further apart.

DESCRIPTION OF THE PREFERRED EMBODIMENTS

As hereinbefore indicated, my invention involves assembling an electroded semiconductor diode laser bar 10 with a support in such a way as to form two discrete diode laser bodies 12 and 14 bonded to a support 16 in precise alignment and spacing for close optical coupling. The semiconductor diode laser bar 10 used to form the two discrete laser bodies 12 and 14 can be formed in any of the known and accepted manners. Analogously, the electroding of the semiconductor bar can be performed in the usual way, provided that it provides a cold bondable soft metal coating 18 on the outer surface of the electrode that contacts the support. An electroding technique which I prefer to use is described in my U.S. Pat. No. 4,350,990, entitled "Electrode for Lead-Salt Diodes", which is assigned to the assignee hereof, and was issued Sept. 21, 1982.

In one specific example of this invention, a lead-tin-telluride semiconductor diode laser wafer (not shown) is first prepared. The semiconductor diode laser wafer is a 200 micrometer thick wafer whose opposed major faces are square and about 3 millimeters on a side. It is composed of monocrystalline $Pb_{0.86} Sn_{0.14} Te$. The <100> crystalline planes of the monocrystalline lead-salt are prependicular to the major faces of the wafer. One major face 20 of the wafer is of P-type conductivity and the other 22 is of N-type conductivity. The wafer has a PN junction 24 parallel its major faces. It divides the thickness of the wafer into a P-type conductivity portion and an N-type conductivity portion, that extend to the aforementioned P-type and N-type wafer faces, respectively. The PN junction 24 thus intersects the edges of the wafer. It is located within less than about 30 micrometers of the N-type conductivity face 22. Hence, most of the wafer is of P-type conductivity.

The wafer is then electroded in the manner described in my aforementioned U.S. Pat. No. 4,350,990. More specifically, the N-type conductivity face 22 is coated with an indium layer 18. The P-type face 20 is doped with oxygen and given a laminated electrode coating, starting with a gold layer. Palladium, gold and indium layers are successively deposited onto the gold layer. The noble metal layers can be about 0.2 micrometers. For simplicity and to avoid distraction from the important facets of this invention, only the outer indium layer is shown in the drawing. The outer indium layer is designated by reference numeral 26. The indium layers 18 and 26 on both faces 20 and 22 are about 1-2 micrometers thick.

The semiconductor diode laser wafer hereinbefore described is large enough to form many laser bodies such as laser bodies 12 and 14. It is cleaved along its <100> crystalline planes in the normal and accepted manner, to form a plurality of semiconductor diode laser strips (not shown) about 600 micrometers wide and about 3 millimeters long. One such strip can be transversely cleaved to form a semiconductor laser diode bar 10, a fragment of which is shown in FIG. 1a. The laser strip is transversely cleaved along lines spaced about 200 micrometers apart to form bar 10. In such instance, the width of the strip, i.e. about 600 micrometers, becomes the length of the resultant bar 10.

At about 600 micrometers in length, each bar 10 comprises two intended Fabry-Perot cavity lengths 12' and 14' disposed end-to-end. These two cavity lengths 12' and 14' will provide an optical resonator formed in accordance with this invention.

As mentioned, one can cleave the wafer and then the strip in any of the usual ways, to form the semiconductor diode laser bar 10 shown in FIGS. 1a and 2. The supporting surface during cleaving should be a metal that is not cold bondable to the bar electrode it contacts. For example, it can be cleaved on a clean flat stainless steel plate (not shown), which is the usual surface used when cleaving. In substance, cleaving is no more critical than usual up to this point in my process.

A copper heat sink 16 having a flat surface 28 coated with a several millimeters thick coating of indium 30 is prepared as a support for the bar 10. A portion of the coated heat sink 16 is shown in FIG. 1b. The bar 10 is placed with its own indium coating 18 face-down on the indium coating 30 of the heat sink 16, as shown in FIG. 2 to form a bar-heat sink assembly.

As also shown in FIG. 2, the bar-heat sink assembly is positioned under a knife edge 32' of a cleaving apparatus whose knife 32 movement can not only be very precisely controlled but whose movement can be viewed under a microscope. The microscope has a movement scale appearing in the field of view. The knife can be considered as like a razor blade that is attached to a micrometer type of device controlling its movement. The semiconductor bar is brittle enough to cleave under a slight pressure applied to the surface of the semiconductor body by the knife edge 32'. This is caused by a slight and highly controlled movement of the knife down into the upper surface of bar 10. The bar has <100> crystalline planes orthogonally transverse to its long edges. The knife 32 is oriented in and parallel these planes, at a desired distance from one end of the bar, such as about 200 micrometers.

Enough pressure is applied to the knife edge 32', while the bar-heat sink assembly is substantially at room temperature, to cleave the bar into two laser bodies 12 and 14, portions of which are shown in FIGS. 3 and 4. These bodies 12 and 14 each form a Fabry-Perot cavity of high quality, since the cleaved faces 34 and 36 are substantially parallel their opposite end faces on their respective bodies. Moreover, the bar (and thus these bodies) concurrently bonds to the heat sink 16, by means of their facing indium coatings 18 and 30, under the cleaving pressure. Hence, the facing cleaved ends of these bodies are concurrently fixed in a position where their respective adjacent cleaved end faces 34 and 36 are substantially parallel each other and substantially in register when viewed from their opposite ends. Hence, the cleaving produces a precisely aligned composite structure.

Movement of the knife 32, or, in a sense pressure of the knife edge 32' during cleaving, is controlled to avoid pushing the laser bodies 12 and 14 too far apart as they are cleaved from the bar 10. Only enough force is applied by knife edge 32 to cause the bar 10 to fracture. Movement of the knife 32 is therefore carefully controlled. It is restricted because knife movement is what is used in this invention to separate the laser bodies 12 and 14 the precise distance desired after cleaving. FIG. 3 shows the laser bodies 12 and 14 bonded to the heat sink 16 immediately after cleaving. It can be seen that the knife edge 32' projects only slightly below the upper surface of the laser bodies 12 and 14.

As shown in FIG. 4, a further force is subsequently applied to the knife edge 32' to cause the knife 32 to move downward further between the two cleaved portions and push them further apart. Since the movement of the knife 32' can be very precisely controlled, and since the cleavage area can be viewed and precisely measured, one can easily move the knife edge 32' further down between the cleaved end portions to move them further apart a precisely predetermined distance, as for example about 8-9 micrometers.

The thickness of the metal layers bonding these two laser bodies 12 and 14 to the heat sink is large compared to the distance the two facing end surfaces 34 and 36 are moved apart. Moreover, the metal of these layers is soft, i.e. ductile. Accordingly, the two laser bodies are readily moved into the proper spacing without any detrimental effect on their bonding to the underlying heat sink. Moreover, since the distance they are moved is small compared to the length of the laser bodies, which is about 200 or 400 micrometers, longitudinal parallelism between the bodies is not significantly disturbed.

The spacing needed to obtain good optical coupling, i.e. constructive interference, between the laser cavities in the two portions cleaved from the semiconductor bar is highly critical, as hereinbefore indicated. It must be a whole integer multiple of the wavelength of the radiation at which the laser cavities are to be operated. For example, for a lead-tin-telluride lead-salt laser body of the composition $Pb_{0.86} Sn_{0.14} Te$ spacing of approximately 8-9 micrometers is needed to provide constructive interference. Other semiconductive materials may require a larger or smaller spacing between the two portions in order to obtain the constructive interference which produces optical coupling. In any event, it would ordinarily always be small compared to the length of the laser cavities involved, and certainly not greater than about 10-15% of the smaller laser cavity length. In this example, this amounts to a spacing less than about 30 micrometers.

The resultant composite structure is then removed from the cleaving apparatus for further assembly in the usual manner. For example, a gold, silver, or platinum wire is subsequently soldered to the upper surface of each laser body on the heat sink. Indium can be used as the solder.

It should be noted here that the spacing needed between the laser bodies 12 and 14 to get the desired optical coupling is readily obtainable by using the same knife edge used to cleave the semiconductor bar 10. On the other hand, there is no objection to using a different knife edge to do it. Hence, the knife 32 shown in FIG. 3 need not be the same knife shown in FIG. 4. Further, while I prefer to perform and describe the cleaving and spacing as separate operations, I recognize that it might be possible to perform both steps in the same operation, in the same stroke. I am not sure this latter thought is practical, however.

I have described this invention in connection with a lead-tin-telluride lead-salt semiconductor material. It is also applicable to other lead-salt semiconductive materials, such as lead-telluride, lead-tin-selenide and lead-sulfide-selenide. I expect this invention to be useful on other semiconductive materials, too.

Indium is a particularly good cold bondable metal for use as layers 18 and 30 with lead-salt semiconductors. However, the invention should not be limited to indium. Any soft metal that will cold bond to its support when cleaved could be used. With different semiconductors, different bonding metals may be preferred, as for example gold or gallium or alloys thereof, or alloys of indium.

Incidentally, the cleaving-bonding step need not be performed at room temperature, although it is preferred at this time for indium coated lead-salt laser structures. It is conceivable that one might choose to elevate the temperature somewhat to enhance bondings, as is done in thermo-compression bonding of gold in other processes, such as wire bonding. I consider such small temperature elevations to be included within the expression cold bonding as used herein. This may permit more bonding metals to be available for use in this invention.

The size of the semiconductor laser body 12 or 14 referred to earlier in this description is not critical to this invention, nor is its thickness. However, lead-salt laser bodies are ordinarily about 200-300 micrometers thick. The width of the strips cleaved from the wafer would correspondingly be about 450-600 micrometers wide, because the length of the two Fabry-Perot cavities to be formed add up to this dimension. However, it can be contemplated that one might want longer or shorter laser cavities. Hence, the last mentioned range might vary.

The thickness of the combined indium layers can vary, too, and still readily accommodate a longitudinal movement of the laser bodies without any disruptive effects. Ordinarily, the indium layers on both of the laser bar 10 and the heat sink 16 would each be at least about one millimeter for a combined thickness of two millimeters. This ought to be enough thickness to accommodate pushing the end faces apart even up to 30 micrometers. If greater spacings are desired, one may wish to consider a larger minimum thickness.

The embodiments of the invention in which an exclusive property or privilege is claimed are defined as follows:

1. In a method of making an optically coupled semiconductor laser the improvement of:

forming a monocrystalline semiconductor diode bar having a length equal to at least two intended Fabry-Perot laser cavities, having crystalline planes perpendicular to bar side walls, and having a cold bondable soft metal coating on one side wall face;

placing the soft metal coated face of the bar on a metallurgically compatible soft metal surface of a supporting means for cold bonding thereto;

applying a controlled force to a knife edge transversely disposed on the opposite face of the bar not only to cleave the bar along one of the crystal planes into two precisely aligned and closely spaced semiconductor diode laser bodies having cleaved and substantially parallel facing end walls, but also to cold bond the bodies in such disposition to the soft metal surface of the supporting means; and applying an additional controlled force to a knife edge between the facing body end wall edges to move the closely spaced bodies a precisely controlled distance further apart on the soft metal surface to which they are bonded, without breaking their bonds to that surface or significantly altering their precise alignment, effective to provide an optical coupling between the laser bodies.

2. In a method of making a cleaved-coupled-cavity semiconductor laser the improvement of:

forming a cleaved monocrystalline semiconductor diode bar having a length equal to two intended Fabry-Perot laser cavities, having crystalline planes perpendicular to bar side walls, and having a cold weldable soft metal coating on one side wall face;

placing the soft metal coated face of the bar on a metallurgically compatible soft metal surface of a supporting heat sink element for cold bonding thereto;

applying a pressure to, while controlling the movement of, a cleaving knife having its edge transversely disposed on the opposite face of the bar not only effective to cleave the bar along one of the crystal planes into two precisely aligned and closely spaced semiconductor diode laser bodies with substantially flat and parallel facing end walls, with each body having its intended Fabry-Perot cavity along its length and thus each body separately functionable as a semiconductor laser, but also effective to cold bond the bodies to the soft metal surface of the supporting heat sink element; and applying an additional force pressure to the knife edge, while controlling its movement between the facing body end wall edges, to move the closely spaced diode laser bodies a precisely controlled distance further apart on the soft metal surface to which they are bonded, without breaking their bonds to that surface or significantly altering their precise alignment, effective to provide a predetermined constructive optical interference between the laser bodies when both function as lasers.

3. In a method of making an electro-optic frequency modulator semiconductor laser, the improvement of:

cleaving an electroded monocrystalline semiconductor diode body to form a bar having two intended Fabry-Perot cavity lengths therein, having an indium coating on one elongated face of the bar, and having a PN junction parallel to that face;

placing the indium coated face of the bar on an indium coated support member;

applying a controlled force to an orthogonally transverse knife edge on the opposite face of the bar sufficient to transversely cleave the bar into two closely aligned semiconductor diode laser bodies and substantially simultaneously cold bond those bodies to the support member; and applying a further controlled force to the knife edge, to move the aligned bonded bodies farther apart to a precisely predetermined spacing, effective to provide two precisely aligned semiconductor diode laser bodies having substantially parallel cleaved end faces spaced substantially a whole integer multiple of laser body operating wavelengths apart, and thereby to form an electro-optic frequency modulator semiconductor diode laser structure.

4. In a method of making an electro-optic frequency modulator semiconductor laser, the improvement of:

cleaving an electroded monocrystalline lead-salt semiconductor diode body along <100> crystal planes to form a bar having two intended Fabry-Perot cavity lengths therein, having an indium coating on one elongated face of the bar, and having a PN junction adjacent and parallel to that face;

placing the indium coated face of the bar on an indium coated support member;

applying a pressure to an orthogonally transverse knife having its edge along a <100> plane on the opposite face of the bar, while limiting the movement thereof, sufficient to simultaneously transversely cleave the bar into two closely aligned semiconductor diode laser bodies and cold bond those bodies to the support member; and applying a further pressure to the knife while precisely limiting its movement, to move the aligned bonded bodies farther apart to a precisely predetermined spacing, effective to provide two precisely aligned semiconductor diode laser bodies having substantially parallel mirror end faces precisely spaced apart appropriately to optically couple them, and thereby form an electro-optic frequency modulator semiconductor diode laser structure.

* * * * *